United States Patent
Ting et al.

(10) Patent No.: US 10,460,925 B2
(45) Date of Patent: Oct. 29, 2019

(54) METHOD FOR PROCESSING SEMICONDUCTOR DEVICE

(71) Applicant: United Microelectronics Corp., Hsinchu (TW)

(72) Inventors: Hsu Ting, Tainan (TW); Kuang-Hsiu Chen, Tainan (TW); Chun-Wei Yu, Tainan (TW); Keng-Jen Lin, Kaohsiung (TW); Yu-Ren Wang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 126 days.

(21) Appl. No.: 15/639,381

(22) Filed: Jun. 30, 2017

(65) Prior Publication Data
US 2019/0006172 A1 Jan. 3, 2019

(51) Int. Cl.
*H01L 21/02* (2006.01)
*H01L 21/311* (2006.01)
*H01L 29/66* (2006.01)

(52) U.S. Cl.
CPC .... *H01L 21/02057* (2013.01); *H01L 21/0206* (2013.01); *H01L 21/31111* (2013.01); *H01L 29/66818* (2013.01)

(58) Field of Classification Search
CPC combination set(s) only.
See application file for complete search history.

(56) References Cited

U.S. PATENT DOCUMENTS

| | | |
|---|---|---|
| 6,689,675 B1 | 2/2004 | Parker et al. |
| 6,692,580 B2 | 2/2004 | Wu et al. |
| 6,733,597 B2 | 5/2004 | Wu et al. |
| 7,192,878 B2 | 3/2007 | Weng et al. |
| 7,628,866 B2 | 12/2009 | Lin et al. |
| 8,283,222 B2 | 10/2012 | Hsu et al. |
| 8,404,533 B2 | 3/2013 | Ma et al. |
| 8,883,033 B2 | 11/2014 | Chen et al. |
| 8,883,621 B2 | 11/2014 | Li et al. |
| 8,987,096 B2 | 3/2015 | Chen et al. |
| 9,117,925 B2 | 8/2015 | Liang et al. |
| 9,646,889 B1 | 5/2017 | Yu et al. |
| 2003/0114018 A1 | 6/2003 | Gutsche et al. |
| 2010/0003803 A1* | 1/2010 | Oka .............. C30B 25/183 438/455 |

(Continued)

OTHER PUBLICATIONS

Chun-Wei Yu et al., "Method for Removing Silicon Nitride Material and Method for Fabricating Semiconductor Device", Unpublished U.S. Appl. No. 14/881,626, filed Oct. 13, 2015.

*Primary Examiner* — Erin F Bergner
(74) *Attorney, Agent, or Firm* — J.C. Patents

(57) ABSTRACT

A method for processing a semiconductor device is provided. The semiconductor device includes a protruding structure on a substrate, the protruding structure having a nitride spacer at a sidewall, and an epitaxial layer is formed in the substrate adjacent to the protruding structure. The method includes removing the nitride spacer on the protruding structure. Then, a dilute hydrofluoric (DHF) cleaning process is performed over the substrate, wherein a top surficial portion of the epitaxial layer is removed. A standard clean (SC) process is performed over the substrate, wherein a native oxide layer is formed on an expose surface of the epitaxial layer.

20 Claims, 3 Drawing Sheets

(56) References Cited

U.S. PATENT DOCUMENTS

2013/0320449 A1* 12/2013 Hoentschel ..... H01L 21/823807
  257/368
2014/0256155 A1* 9/2014 Ting ................ G03F 7/423
  438/778
2016/0155647 A1   6/2016 Brown et al.

* cited by examiner

METHOD FOR PROCESSING SEMICONDUCTOR DEVICE

BACKGROUND

1. Field of the Invention

The present invention generally relates to semiconductor fabrication, and particularly to a method for processing a semiconductor structure to remove nitride material.

2. Description of Related Art

An integrated circuit device usually includes a large number of field effect transistor's (FET's), so to form the memory cell, circuit, and so on. As to the structure of the transistor, various types of FET have been proposed, in which the fin FET (FinFET) in new generation has also been proposed. Generally, the basic parts of the FET include gate structure, source region and drain region. In order to improve the performance of the FET, the source region and the drain region are formed by epitaxial material to replace the conventional silicon.

In fabrication, the epitaxial layer is grown on the silicon substrate. To define the width of the source region or drain region, protruding structures are usually formed on the substrate or the fin for the FinFET, so the epitaxial layer is formed in the substrate between the protruding structures. The protruding structure can be the polysilicon protruding structure or any other. The protruding structure usually includes nitride spacer at the sidewall of the protruding structure. The nitride spacer would be cleaned away. The epitaxial layer is potentially damaged as well.

How to protect the epitaxial layer during removing the nitride spacer is the issue necessarily been concerned.

SUMMARY OF THE INVENTION

The invention provides a method for processing the semiconductor device, in which the epitaxial layer can be protected well.

In an embodiment, the invention provides a method for processing a semiconductor device. The semiconductor device includes a protruding structure on a substrate, the protruding structure having a nitride spacer at a sidewall, and an epitaxial layer is formed in the substrate adjacent to the protruding structure. The method includes removing the nitride spacer on the protruding structure. Then, a dilute hydrofluoric (DHF) cleaning process is performed over the substrate, wherein a top surficial portion of the epitaxial layer is removed. A standard clean (SC) process is performed over the substrate, wherein a native oxide layer is formed on an expose surface of the epitaxial layer.

In an embodiment, the invention provides a method for processing a semiconductor device. The method comprises providing a semiconductor structure. The semiconductor structure includes a protruding structure on a substrate, the protruding structure having a nitride spacer at a sidewall, and an epitaxial layer is formed in the substrate adjacent to the protruding structure. The method includes removing the nitride spacer on the protruding structure. Then, a dilute hydrofluoric (DHF) cleaning process is performed over the substrate, wherein a top surficial portion of the epitaxial layer is removed. A standard clean (SC) process is performed over the substrate, wherein a native oxide layer is formed on an expose surface of the epitaxial layer.

In an embodiment, as to the method, the protruding structure comprises a first protruding structure and a second protruding structure, the nitride spacer is formed on a sidewall of the first protruding structure and the second protruding structure, and the epitaxial layer is in the substrate between the first protruding structure and the second protruding structure.

In an embodiment, as to the method, the substrate is silicon and the epitaxial layer is SiGe.

In an embodiment, as to the method, the epitaxial layer of the semiconductor device has a concave at a sidewall top adjacent to the protruding structure.

In an embodiment, as to the method, the step of performing the DHF cleaning process reduces a depth of the concave.

In an embodiment, as to the method, the step of removing the nitride spacer comprises performing a preliminary DHF cleaning process over the substrate and performing a $H_3PO_4$ cleaning process over the substrate.

In an embodiment, as to the method, the substrate comprises a fin structure, and the epitaxial layer is formed on the fin structure.

In an embodiment, as to the method, the protruding structure comprises polysilicon protruding part.

In an embodiment, as to the method, the protruding structure is a composites structure.

In an embodiment, as to the method, the standard clean process comprises a SC 1 process or a SC 2 process.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to a technology for cleaning a nitride spacer on the sidewall of a protruding structure with less damage on the epitaxial layer on the substrate beside the protruding structure.

Several embodiments are provided for describing the invention, but the invention is not limited to the embodiments.

Figure 1:
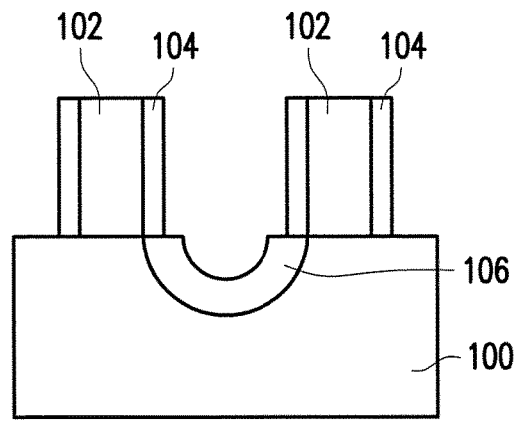
FIG. 1 is a drawing, schematically illustrating a cross-sectional view of a semiconductor structure of a semiconductor device, according to an embodiment of the invention.

FIG. 1 is a drawing, schematically illustrating a cross-sectional view of a semiconductor structure of a semiconductor device, according to an embodiment of the invention. Referring to FIG. 1, for fabricating the semiconductor device, a semiconductor structure at the middle stage, not the final structure, would be formed. At this stage, a protruding structure 102 is formed on a substrate 100. Here, the substrate 100 can be a silicon substrate in an example. Further to the FinFET structure, the substrate 100 as shown represents the fin structure, which is also a part of the substrate 100. The protruding structure 102 can be composite structure, including multiple intern layers, in which polysilicon protruding may be included. The invention is not limited a specific protruding structure with internal structure. However, a nitride spacer 104 are formed on the sidewall of the protruding structure 102.

The epitaxial layer 106, serving as a source region or a drain region in an example, is formed on the substrate 100. The epitaxial layer 106 is also a semiconductor material, such as SiGe. The epitaxial layer 106 is formed between two adjacent protruding structures 102.

Figure 2:
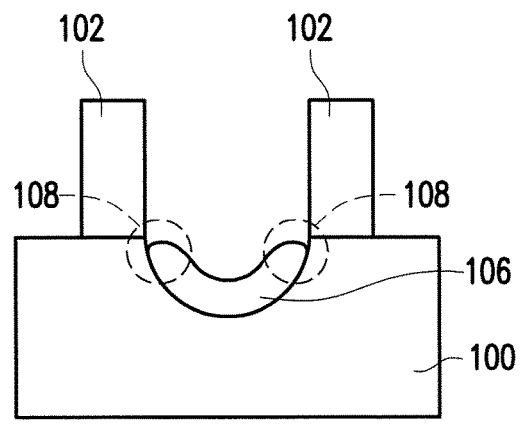
FIG. 2 is a drawing, schematically illustrating schematically illustrating a cross-sectional view of a semiconductor structure of a semiconductor device with a weak point after clean the nitride material, according to an embodiment of the invention.

FIG. 2 is a drawing, schematically illustrating schematically illustrating a cross-sectional view of a semiconductor structure of a semiconductor device with a weak point after clean the nitride material, according to an embodiment of the invention. Referring to FIG. 2, the nitride spacer 104 in the semiconductor structure of FIG. 1 is usually removed away by the cleaning procedure to expose the protruding structure as intended.

The nitride material of the nitride spacer 104 is usually removed or cleaned by performing the dilute hydrofluoric acid (DHF) cleaning process and then performing phosphoric acid ($H_3PO_4$) cleaning process, in which the nitride material with litter oxide are etched away for cleaning. However, a top surficial portion of the epitaxial layer 106 is also removed.

The invention has looked into the structure of the epitaxial layer 106 and found that the sidewall top of the epitaxial layer 106, seen as the top corner in the cross-sectional view, has a weak point 108, of which the epitaxial layer 106 is over etched and form a concave. This uneven structure beside the protruding structure 102 is the weak point, easily causing the malfunction of the device after completion of fabrication.

Figure 3:
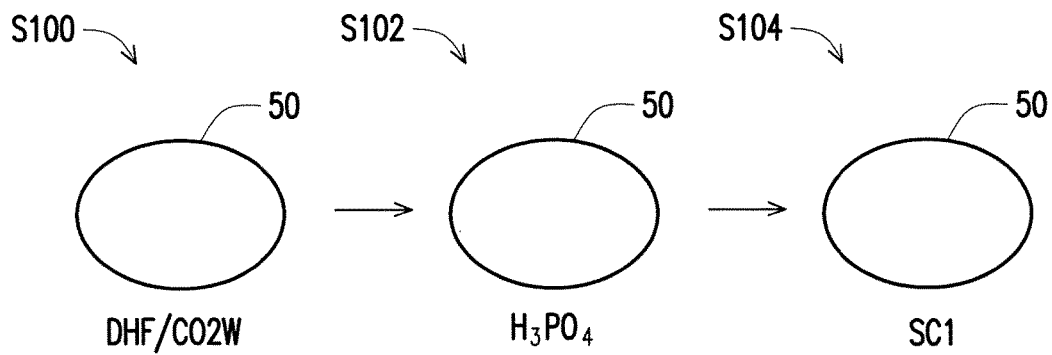
FIG. 3 is a drawing, schematically illustrating a processing procedure on the semiconductor device, according to an embodiment of the invention.

The invention has looked into the cleaning procedure for removing the nitride layer and try to propose the solution to reduce the weak point 108. FIG. 3 is a drawing, schematically illustrating a processing procedure on the semiconductor device, according to an embodiment of the invention. Referring to FIG. 3, the method for processing the semiconductor structure in FIG. 1 to remove the nitride spacer 104 performs a DHF cleaning process in step S100 over a wafer 50, which has the semiconductor structure as shown in FIG. 1 formed thereon. The silicon wafer 50 provides the substrate 100 in FIG. 1 and FIG. 2. Here, the DHF cleaning process may also involve a rinse process of $CO_2$ with water (CO2W).

In step S102, the $H_3PO_4$ cleaning process is further performed. After the $H_3PO_4$ cleaning process the nitride spacer 104 in FIG. 1 can be removed. In step S104, the stander clean 1 (SC1) process is performed over the wafer 50. However, the weak point 108 as shown in FIG. 2 has been observed at the end.

The invention has looked into the issue and found that, the weak point 108 may be caused by the $H_3PO_4$ cleaning process, which is over removing the epitaxial material to cause the surface of the epitaxial layer 106 to be not smooth. Although the SC1 process with water and hydrogen peroxide component may form a native oxide over the epitaxial layer 106, it is still not sufficient to solve the concave of the weak point 108. Here, as an example, the recipe of SC1 in an example includes 5 parts of deionized water, 1 part of aqueous $NH_4OH$ (ammonium hydroxide, 29% by weight of $NH_3$) and one part of aqueous $H_2O_2$ (hydrogen peroxide, 30%). However, the standard clean 2 (SC2) process may be taken to replace the SC1 process. Generally, the SC1 process and the SC2 process can be generally called as a standard clean (SC) process.

After looking into the issue above, the invention has proposed another method for processing the semiconductor device. FIG. 5 is a drawing, schematically illustrating cross-sectional view of a semiconductor structure of a semiconductor device based on the cleaning procedure in FIG. 4, according to an embodiment of the invention.

Referring to FIG. 5, in step S200, a DHF cleaning process is performed over a wafer 50, which has the semiconductor structure as shown in FIG. 1 formed thereon. The silicon wafer 50 provides the substrate 100 in FIG. 1 and FIG. 2. Here, the DHF cleaning process may also involve a rinse process of $CO_2$ with water (CO2W). In step S202, the $H_3PO_4$ cleaning process is further performed. The step S200 and the step S202 are similar to the step S100 and the step S102 in FIG. 3.

However, to reduce the weak point 108, the invention has added the step S204 before performing the step S206 for the SC1 process. In the step S204, an additional DFH process is performed, in which the rinse of CO2W may be involved. The effect of the additional DFH process may further clean the epitaxial layer 106, so to smooth the top exposed surface, in which the concave of the weak point 108 can be smoothed away to provide a better smooth surface. After then, in step S206, the SC1 process can start from the smooth surface of the epitaxial layer 106.

Figure 4:
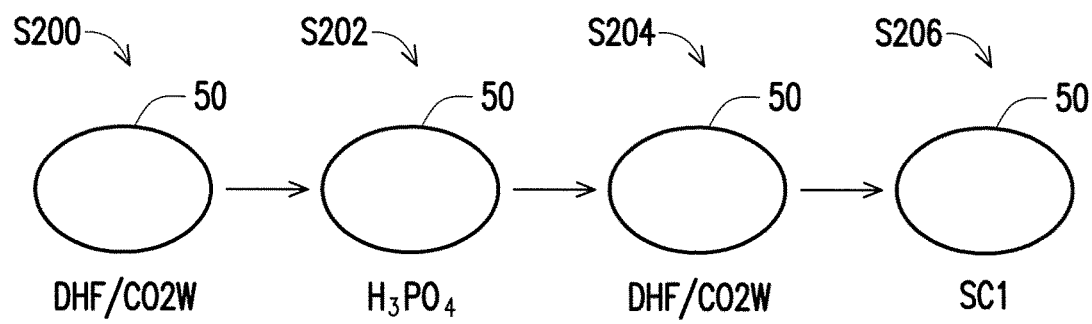
FIG. 4 is a drawing, schematically illustrating a cleaning procedure on the semiconductor device, according to an embodiment of the invention.
Figure 5:
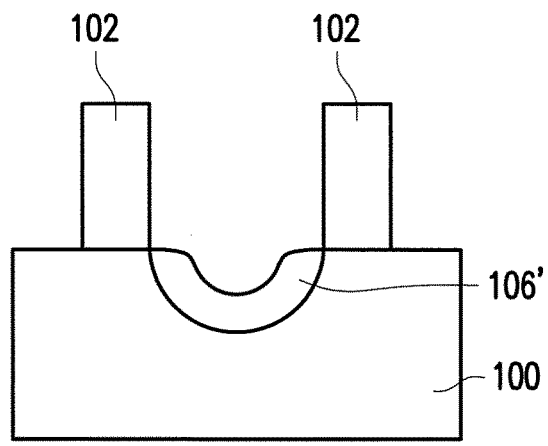
FIG. 5 is a drawing, schematically illustrating cross-sectional view of a semiconductor structure of a semiconductor device based on the cleaning procedure in FIG. 4, according to an embodiment of the invention.

FIG. 5 is a drawing, schematically illustrating cross-sectional view of a semiconductor structure of a semiconductor device based on the cleaning procedure in FIG. 4, according to an embodiment of the invention. Referring to FIG. 5, due to the additional step S204, the epitaxial layer 106' gets better smooth surface with reduced depth of the concave of the weak point 108.

To verify the quality of the epitaxial structure under the processes of the invention, various physical phenomena have been tested, such as surface roughness or quality of native silicon oxide on the epitaxial layer, or the observation on the actual structure at the weak point. The invention can effectively reduce the weak point to get smoother surface.

Figure 6:
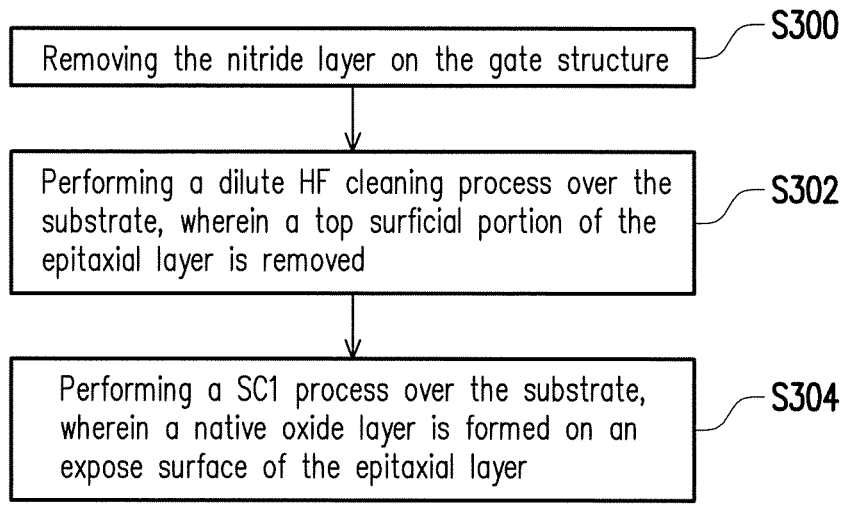
FIG. 6 is a drawing, schematically illustrating a flow of the method for processing a semiconductor device, according to an embodiment of the invention.
Figure 7:
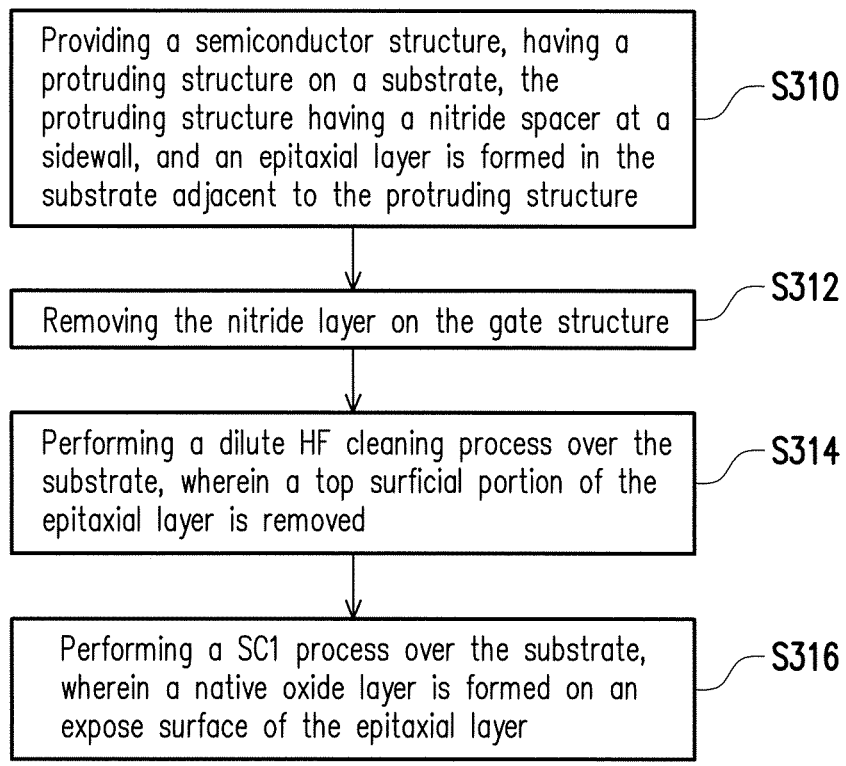
FIG. 7 is a drawing, schematically illustrating a flow of the method for processing a semiconductor device, according to an embodiment of the invention.

As to the foregoing descriptions, the invention generally is directed to a method for processing a semiconductor device. FIG. 6 is a drawing, schematically illustrating a flow of the method for processing a semiconductor device, according to an embodiment of the invention. The semiconductor structure in FIG. 1 is taken as an example for processing. Referring to FIG. 6, in step S300, the nitride spacer on the protruding structure is removed. In step S302, a dilute hydrofluoric acid cleaning process is performed over the substrate, wherein a top surficial portion of the epitaxial layer is removed. In step S304, a standard clean (SC) process, such as SC1 process, is performed over the substrate, wherein a native oxide layer is formed on an expose surface of the epitaxial layer.

From the other point of view, in an embodiment, a method for processing a semiconductor device is provided. The method comprises providing a semiconductor structure in step S310. The semiconductor structure includes a protruding structure on a substrate, the protruding structure having a nitride spacer at a sidewall, and an epitaxial layer is formed in the substrate adjacent to the protruding structure. The method includes the step 312 for removing the nitride spacer on the protruding structure. Then, in step S314, a dilute hydrofluoric (DHF) cleaning process is performed over the substrate, wherein a top surficial portion of the epitaxial layer is removed. In step S316, a standard clean (SC) process, such as SC1 process, is performed over the substrate, wherein a native oxide layer is formed on an expose surface of the epitaxial layer.

As noted, the substrate can be a usual substrate or the fin structure in an embodiment. The step of removing the nitride spacer may include performing a preliminary DHF cleaning process over the substrate, and performing a $H_3PO_4$ cleaning process over the substrate.

The invention has proposed the additional DHF process in step S302 or S314 after removing the nitride material. The top surface of the epitaxial layer can be smoother, so to all the subsequent SC1 process to perform in better quality.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for processing a semiconductor device, wherein the semiconductor device comprises a protruding structure on a substrate, the protruding structure having a nitride spacer at a sidewall, and an epitaxial layer is formed in the substrate adjacent to the protruding structure, the method comprising:
    removing the nitride spacer on the protruding structure, wherein a portion of the epitaxial layer under the nitride spacer is further exposed;
    performing a dilute hydrofluoric acid (DHF) cleaning process over the substrate after removing the nitride spacer, wherein a top surficial portion of the epitaxial layer is removed; and
    performing a standard clean (SC) process over the substrate, wherein a native oxide layer is formed on an expose surface of the epitaxial layer.

2. The method of claim 1, wherein the protruding structure comprises a first protruding structure and a second protruding structure, the nitride spacer is formed on a sidewall of the first protruding structure and the second protruding structure, and the epitaxial layer is in the substrate between the first protruding structure and the second protruding structure.

3. The method of claim 1, wherein the substrate is silicon and the epitaxial layer is SiGe.

4. The method of claim 1, wherein the epitaxial layer of the semiconductor device has a concave at a sidewall top adjacent to the protruding structure.

5. The method of claim 4, wherein the step of performing the DHF cleaning process reduces a depth of the concave.

6. The method of claim 1, wherein the step of removing the nitride spacer comprises:
    performing a preliminary DHF cleaning process over the substrate; and
    performing a $H_3PO_4$ cleaning process over the substrate.

7. The method of claim 1, wherein the substrate comprises a silicon fin structure, and the epitaxial layer is formed on the fin structure.

8. The method of claim 1, wherein the protruding structure comprises polysilicon protruding part.

9. The method of claim 1, wherein the protruding structure is a composites structure.

10. The method of claim 1, wherein the SC process comprises a SC 1 process or a SC 2 process.

11. A method for processing a semiconductor device, comprising:
    providing a semiconductor structure, having a protruding structure on a substrate, the protruding structure having a nitride spacer at a sidewall, and an epitaxial layer is formed in the substrate adjacent to the protruding structure;
    removing the nitride spacer on the protruding structure, wherein a portion of the epitaxial layer under the nitride spacer is further exposed;
    performing a dilute hydrofluoric acid (DHF) cleaning process over the substrate after removing the nitride spacer, wherein a top surficial portion of the epitaxial layer is removed; and
    performing a standard clean (SC) process over the substrate, wherein a native oxide layer is formed on an expose surface of the epitaxial layer.

12. The method of claim 11, wherein the protruding structure comprises a first protruding structure and a second protruding structure, the nitride spacer is formed on a sidewall of the first protruding structure and the second protruding structure, and the epitaxial layer is in the substrate between the first protruding structure and the second protruding structure.

13. The method of claim 11, wherein the substrate is silicon and the epitaxial layer is SiGe.

14. The method of claim 11, wherein the epitaxial layer of the semiconductor device has a concave at a sidewall top adjacent to the protruding structure.

15. The method of claim 14, wherein the step of performing the DHF cleaning process reduces a depth of the concave.

16. The method of claim 11, wherein the step of removing the nitride spacer comprises:
    performing a preliminary DHF cleaning process over the substrate; and
    performing a $H_3PO_4$ cleaning process over the substrate.

17. The method of claim 11, wherein the substrate comprises a silicon fin structure, and the epitaxial layer is formed on the fin structure.

18. The method of claim 11, wherein the protruding structure comprises polysilicon protruding part.

19. The method of claim 11, wherein the protruding structure is a composites structure.

20. The method of claim 11, wherein the SC process comprises a SC 1 process or a SC 2 process.

* * * * *